US 10,648,867 B2

(12) United States Patent
Innes et al.

(10) Patent No.: US 10,648,867 B2
(45) Date of Patent: May 12, 2020

(54) MAGNETIC TEMPERATURE SENSOR

(71) Applicant: AT&T Intellectual Property I, L.P., Atlanta, GA (US)

(72) Inventors: Timothy Innes, Atlanta, GA (US); David Spivey, Jr., Smyrna, GA (US); Kevin Igoe, Atlanta, GA (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 482 days.

(21) Appl. No.: 15/432,209

(22) Filed: Feb. 14, 2017

(65) Prior Publication Data

US 2018/0231422 A1    Aug. 16, 2018

(51) Int. Cl.
| G01K 7/36 | (2006.01) |
| G01R 33/02 | (2006.01) |
| G01K 7/38 | (2006.01) |
| G01K 13/00 | (2006.01) |

(52) U.S. Cl.
CPC .............. *G01K 7/36* (2013.01); *G01K 7/38* (2013.01); *G01K 13/00* (2013.01); *G01R 33/02* (2013.01)

(58) Field of Classification Search
CPC G01K 7/38; G01K 7/36; G01K 13/00; G01N 25/72; G01N 27/9046; G01N 27/023; G01N 27/72; G01R 33/02; G01R 33/0206; G01R 33/0035; G01C 17/30; A61B 2017/00084; A61B 5/05
USPC ...................... 374/163, 177, 170, 1; 324/200
See application file for complete search history.

(56) References Cited

U.S. PATENT DOCUMENTS

| 1,472,845 | A | * | 11/1923 | Kelley | ............... B65D 47/2018 222/494 |
| 2,756,595 | A | * | 7/1956 | Cluwen | .................... G01K 7/38 236/88 |
| 3,808,508 | A | | 4/1974 | Ford | |
| 3,865,557 | A | * | 2/1975 | Andres | ..................... C09K 5/08 257/E39.006 |
| 4,576,781 | A | * | 3/1986 | Duncombe | .............. G01K 7/38 374/176 |
| 4,929,899 | A | | 5/1990 | Weixelman et al. | |
| 5,001,426 | A | | 3/1991 | Frey et al. | |
| 5,739,686 | A | | 4/1998 | Naughton et al. | |
| 5,825,105 | A | * | 10/1998 | Barber | .................... B60L 13/10 310/12.31 |

(Continued)

FOREIGN PATENT DOCUMENTS

| EP | 000170824 A1 * | 2/1986 |
| FR | 2930042 A1 * | 10/2009 |

OTHER PUBLICATIONS

B.B. Dang. "Ultra-high Sensitivity Magnetic Field and Magnetization Measurements with an Atomic Magnetometer", dated Oct. 12, 2009. pp. 1-4.

*Primary Examiner* — Gail Kaplan Verbitsky

(57) ABSTRACT

In one example, the present disclosure describes a magnetic temperature sensor. For instance, in one example, an apparatus includes a first magnet, a magnetometer housing the first magnet, and a temperature converter coupled to the magnetometer. The first magnet includes a material having a magnetic field whose strength fluctuates in response to changes in temperature. The magnetic field induces an electric current in the magnetometer. The temperature converter then converts a measurement of the electric current to a corresponding measurement of temperature.

20 Claims, 4 Drawing Sheets

(56) References Cited

U.S. PATENT DOCUMENTS

| | | | |
|---|---|---|---|
| 7,652,473 B2 | 1/2010 | Kawabata | |
| 2003/0210050 A1* | 11/2003 | Prammer | G01V 3/32 |
| | | | 324/315 |
| 2004/0119470 A1* | 6/2004 | Yajima | G01V 3/105 |
| | | | 324/253 |
| 2008/0268416 A1* | 10/2008 | Wallace | G09B 5/062 |
| | | | 434/317 |
| 2010/0276501 A1* | 11/2010 | Yoshimura | A61B 5/01 |
| | | | 236/101 R |
| 2014/0355644 A1* | 12/2014 | Gupta | G01K 7/38 |
| | | | 374/4 |
| 2016/0358760 A1* | 12/2016 | Watson | A61B 18/042 |
| 2017/0098356 A1* | 4/2017 | Dai | G08B 13/2491 |
| 2019/0041469 A1* | 2/2019 | Li | G01R 33/0017 |

\* cited by examiner

MAGNETIC TEMPERATURE SENSOR

The present disclosure relates generally to temperature sensors, and relates more particularly to temperature sensors that use fluctuating magnetic fields to measure temperature with increased sensitivity.

BACKGROUND

Temperature sensors are frequently used in industry, manufacturing, and other applications. For instance, accurate, reliable measures of temperature are generally useful in ensuring efficient system operation. Accurate temperature measurements are also useful in more specific tasks, like freeze protection and process maintenance.

SUMMARY

In one example, the present disclosure describes a magnetic temperature sensor. For instance, in one example, an apparatus includes a first magnet, a magnetometer housing the first magnet, and a temperature converter coupled to the magnetometer. The first magnet includes a material having a magnetic field whose strength fluctuates in response to changes in temperature. The magnetic field induces an electric current in the magnetometer. The temperature converter then converts a measurement of the electric current to a corresponding measurement of temperature.

In another example, an electric current is measured. The electric current is induced in a magnetometer by a magnetic field whose strength fluctuates in response to changes in temperature. A measurement of the electric current is converted to a measurement of temperature.

In another example, a device includes a processor and a computer-readable medium storing instructions which, when executed by the processor, cause the processor to perform operations. The operations include measuring an electric current induced in a magnetometer by a magnetic field whose strength fluctuates in response to changes in temperature and converting a measurement of the electric current to a measurement of temperature.

BRIEF DESCRIPTION OF THE DRAWINGS

The teachings of the present disclosure can be readily understood by considering the following detailed description in conjunction with the accompanying drawings, in which.

To facilitate understanding, identical reference numerals have been used, where possible, to designate identical elements that are common to the figures.

DETAILED DESCRIPTION

In one example, the present disclosure provides a magnetic temperature sensor. As discussed above, temperature sensors are frequently used to provide temperature measurements in industry, manufacturing, and other applications. Examples of the present disclosure provide a temperature sensor based on a magnet whose magnetic field is responsive to temperature changes. For instance, the magnetic field may weaken when exposed to heat and strengthen when exposed to cold. Changes in the magnetic field can be measured with an accuracy to the tens of femtoteslas (where one femtotesla is equal to one hundred trillionth of one tesla) and translated into temperature changes that are similarly precise. In one example, the magnet on which the temperature sensor is based is a Pervoskite material.

Figure 1:
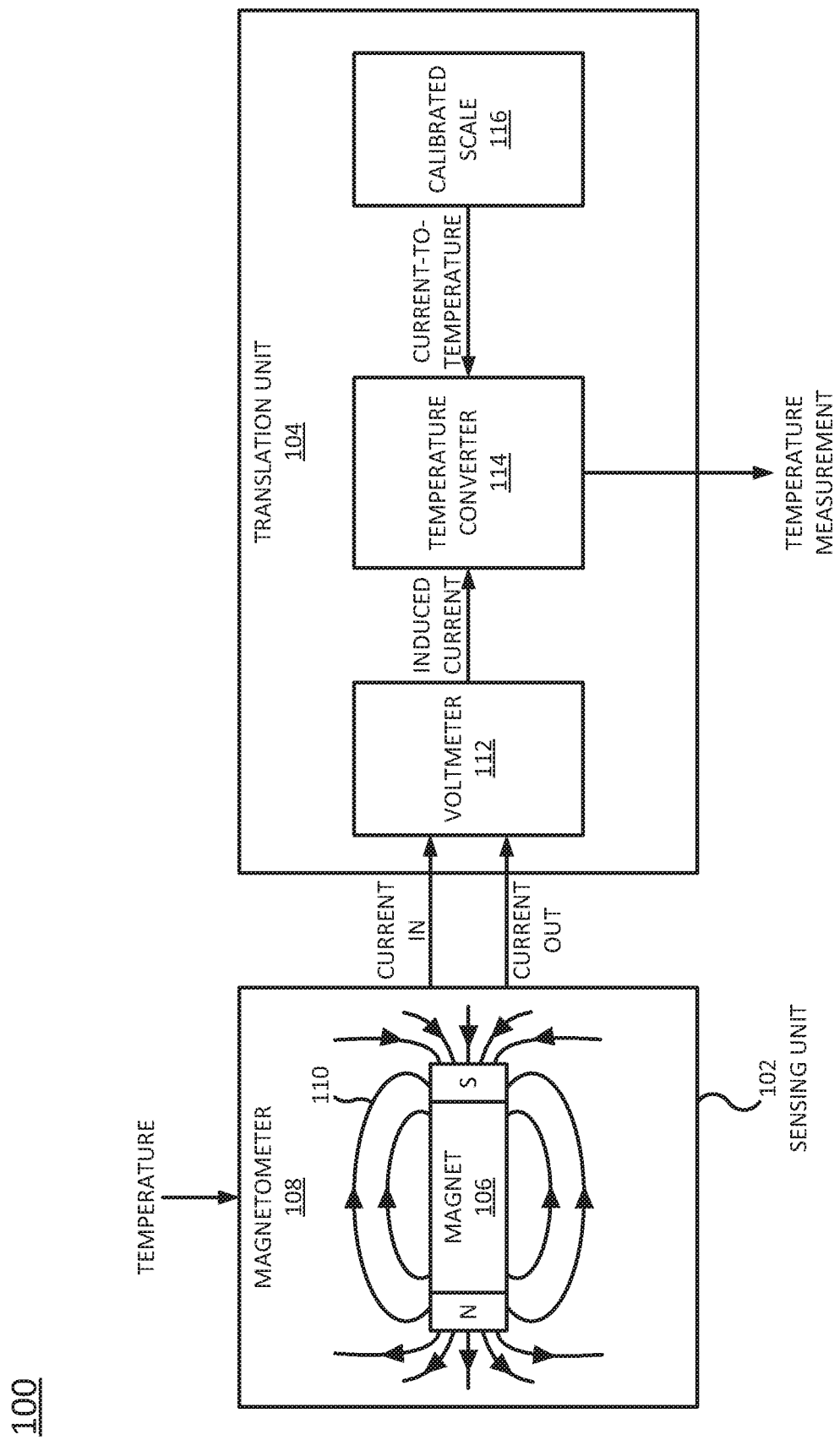
FIG. 1 illustrates a high-level block diagram of an example of a temperature sensor of the present disclosure.

To further aid in understanding the present disclosure, FIG. 1 illustrates a high-level block diagram of an example of a temperature sensor 100 of the present disclosure. In one example, the temperature sensor 100 generally comprises a sensing unit 102 for sensing temperature and a translation unit 104 for translating signals from the sensing unit 102 into a temperature measurement.

The sensing unit 102 comprises a magnet 106 housed within a magnetometer 108. In one example, the magnet 106 is a permanent magnet whose magnetic field 110 is responsive to temperature. That is, the strength of the magnetic field 110 fluctuates in response to changes in temperature. For instance, the magnetic field 110 may weaken when exposed to heat and strengthen when exposed to cold. In one example, the magnet comprises a Pervoskite material.

The magnetometer 108 houses the magnet 106 and isolates the magnet's magnetic field 110, e.g., by blocking out ambient and external magnetic fields (e.g., the Earth's magnetic field). The magnetometer 108 also measures the strength of the magnetic field 110. In one example, the magnetometer 108 comprises an inductive pickup coil, as illustrated in further detail in FIG. 2. In this case, the magnet's changing magnetic field 110 will induce a proportional electric current in the inductive pickup coil. However, in other examples, the magnetometer 108 may take other forms. In one example, the magnetometer 108 generates signals indicative of the current flowing into and out of the sensing unit 102. As discussed in further detail below, these signals may be used by the translation unit 104 to produce a temperature measurement.

The translation unit 104 comprises a voltmeter 112, a temperature converter 114, and a calibrated scale or index 116. The voltmeter 112, a temperature converter 114, and a calibrated scale or index 116 work together to convert signals provided by the sensing unit 102 into a temperature measurement.

In one example, the voltmeter 112 comprises a digital voltmeter that receives signals from the sensing unit 102 that indicate the current flowing into and out of the sensing unit 102. From these signals, the voltmeter 112 can measure the electric current induced in the magnetometer 108 by the magnet's changing magnetic field 110.

The temperature converter 114 receives the induced electric current measured by the voltmeter 112. The temperature converter 114 also has access to the calibrated scale 116, which comprises an index or mapping of electric current measurements to corresponding temperature measurements on a pre-calibrated scale. For instance, in one example, the calibrated scale is generated by calibrating the temperature sensor 100 with hot and cold baths. The temperature converter 114 may look up the induced electric current measured by the voltmeter 112 on the calibrated scale 116 to determine the temperature measurement that corresponds to the induced electric current. The temperature converter 114 may output the temperature measurement, e.g., to a display or other output device.

Thus, in short, a change in a temperature to which the temperature sensor 100 is exposed will induce a change in the strength of the magnetic field 110 of the magnet 106. The strength of the magnetic field 110 is proportional to a current induced in the magnetometer 108. This current can be converted by the translation unit 104 into a corresponding temperature using a pre-calibrated scale 116.

Figure 2:
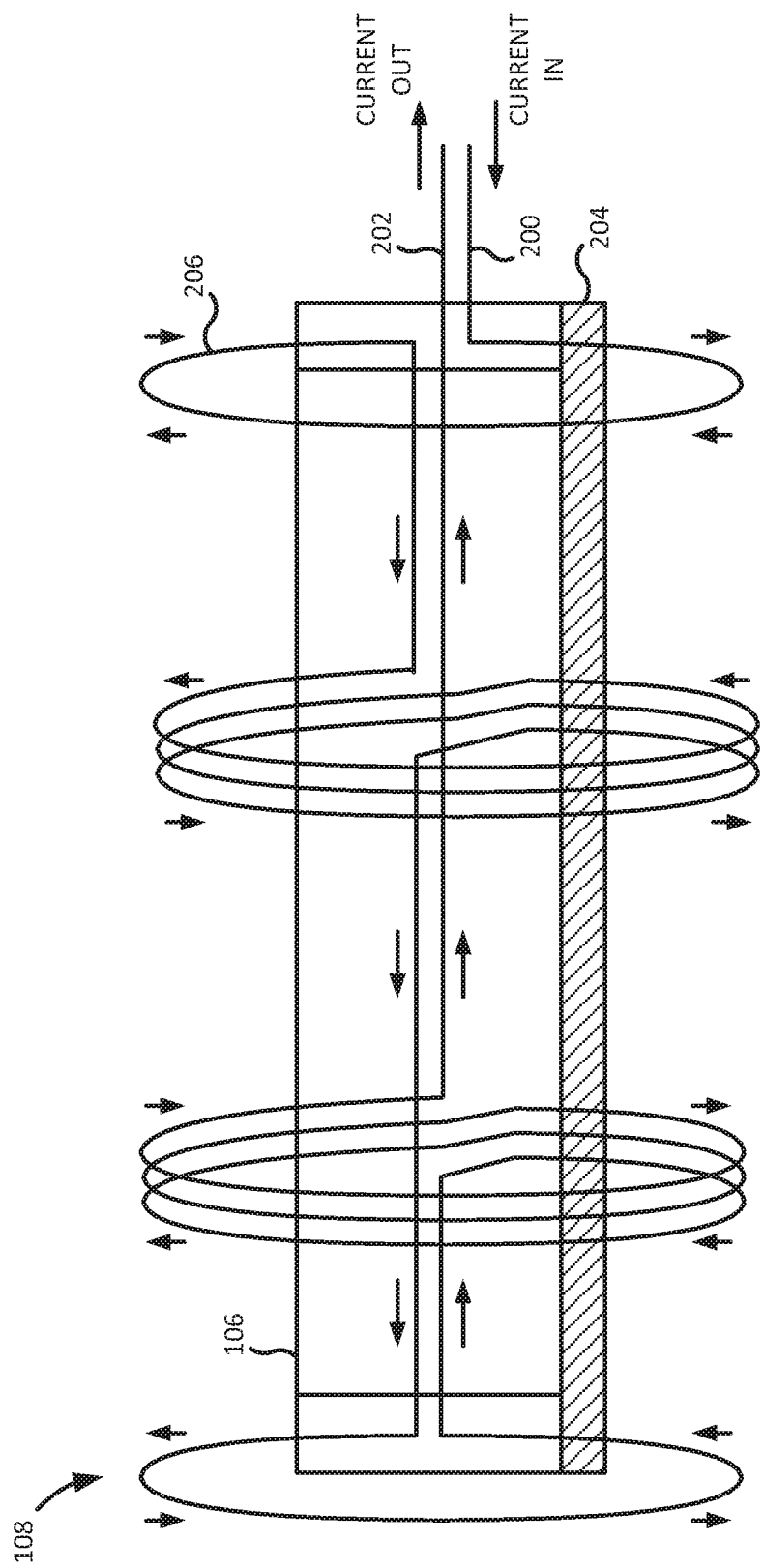
FIG. 2 illustrates a first example of the sensing unit of FIG. 1 in more detail.

FIG. 2 illustrates a first example of the sensing unit 102 of FIG. 1 in more detail. In particular, FIG. 2 illustrates a sensing unit 102 in which the magnetometer 108 is a counter-wound inductive pickup coil. As illustrated, the counter-wound inductive pickup coil comprises counter-wound pairs of coils or loops that define a generally cylindrical shell 206. Notably, the counter-wound inductive pickup coil may comprise any number of coils. An electric current flows into the counter-wound inductive pickup coil via an inlet 200, follows a path through the coils as indicated by the arrows (which indicate the direction of flow), and flows out via an outlet 202. The coils are paired in such a way that the electric current runs in a first direction through one of the coils and in a second, opposite direction through the paired partner coil.

The magnet 106 is positioned inside the coils, e.g., within the generally cylindrical shell 206. As discussed above, the counter-wound configuration of the coils isolates the magnet 106 from external magnetic fields, thereby allowing the magnetometer 108 to accurately measure the electric current induced by changes in the strength of the magnet's magnetic field 110 without interference.

In one example, a "booster" magnet 204 may additionally be placed within the coils, e.g., alongside the magnet 106. The booster magnet 204 is an additional permanent magnet whose own magnetic field acts to enhance the electric current induced by the magnetic field 110 of the magnet 106. In one example, the booster magnet 204 may comprise a ferromagnetic ribbon.

Figure 3:
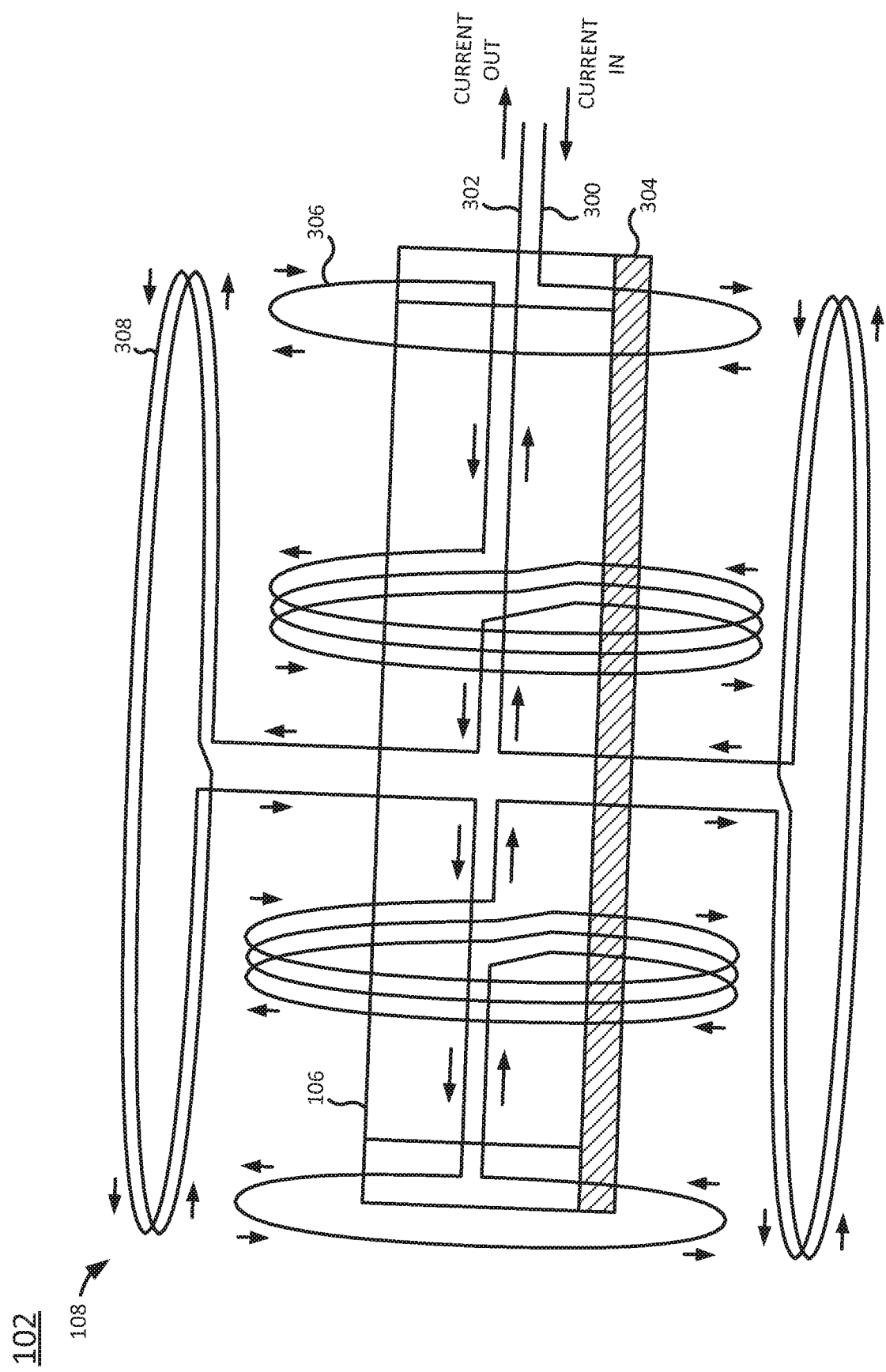
FIG. 3 illustrates a second example of the sensing unit of FIG. 1 in more detail.

FIG. 3 illustrates a second example of the sensing unit 102 of FIG. 1 in more detail. In particular, FIG. 3 illustrates a sensing unit 102 in which the magnetometer 108 is a counter-wound inductive pickup coil with an extra set of external coils for extra magnetic shielding. Similar to the counter-wound inductive pickup coil illustrated in FIG. 2, the counter-wound inductive pickup coil of FIG. 3 comprises counter-wound pairs of coils or loops that define a generally cylindrical shell 306. However, the counter-wound inductive pickup coil of FIG. 3 further includes an extra set of external coils 308 positioned around the generally cylindrical shell 306. In one example, the extra set of external coils 308 is positioned around the longest dimension (e.g., the lengthwise dimension) of the generally cylindrical shell 306. An electric current flows into the counter-wound inductive pickup coil via an inlet 300, follows a path through the coils of the generally cylindrical shell 306 and the extra set of external coils 308 as indicated by the arrows (which indicate the direction of flow), and flows out via an outlet 302. The coils are paired in such a way that the electric current runs in a first direction through one of the coils and in a second, opposite direction through the paired partner coil.

The magnet 106 is positioned inside the coils, e.g., within the generally cylindrical shell 306. As discussed above, the counter-wound configuration of the coils isolates the magnet 106 from external magnetic fields, thereby allowing the magnetometer 108 to accurately measure the electric current induced by changes in the strength of the magnet's magnetic field 110 without interference. Furthermore, the extra set of external coils 308 provides extra magnetic shielding of the magnet 106. Extra magnet shielding may be useful, for instance, in examples where the temperature sensor 100 is part of a system that includes multiple magnetic elements or where the temperature sensor 100 may be exposed to extreme environments.

In one example, a "booster" magnet 304 may additionally be placed within the coils, e.g., alongside the magnet 106. The booster magnet 304 is an additional permanent magnet whose own magnetic field acts to enhance the electric current induced by the magnetic field 110 of the magnet 106. In one example, the booster magnet 304 may comprise a ferromagnetic ribbon.

A temperature sensor such as that illustrated in FIGS. 1-3 is capable of measuring temperatures with increased sensitivity. Moreover, the disclosed temperature sensor is simple and inexpensive to manufacture. Its lack of moving parts makes it very durable, whereas the simplicity of the design makes it easy to scale down to nanoscales or up to industrial scales.

Figure 4:
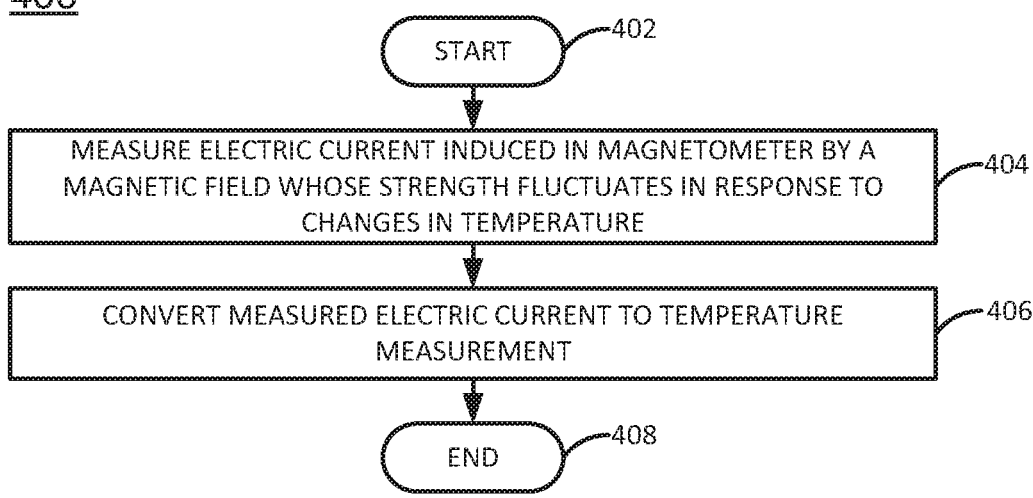
FIG. 4 is a flow diagram illustrating one example of a method 400 for measuring temperature according to the present disclosure.

FIG. 4 is a flow diagram illustrating one example of a method 400 for measuring temperature according to the present disclosure. The method 400 may be performed, for example, by the translation unit 104 of FIG. 1. As such, reference may be made in the discussion of the method 400 to various items illustrated in claim 1. However, such reference is not intended to limit the means by which the method 400 may be performed.

The method 400 begins in step 402. In step 404, the translation unit 104 measures (e.g., via the voltmeter 112) an electric current induced in a magnetometer by a magnetic field whose strength fluctuates in response to changes to temperature. In one example, the magnetic field is generated by a magnet comprising a Pervoskite material, which is housed within the magnetometer.

In step 406, the translation unit 104 converts (e.g. via the temperature converter 114) the measured electric current to a temperature measurement. In one example, the translation unit 104 consults a calibrated scale (e.g., calibrated scale 116) that maps electric current measurements to corresponding temperature measurements on a pre-calibrated scale.

The method 400 ends in step 408.

Although not expressly specified above, one or more steps of the method 400 may include a storing, displaying and/or outputting step as required for a particular application. In other words, any data, records, fields, and/or intermediate results discussed in the method can be stored, displayed and/or outputted to another device as required for a particular application. Furthermore, operations, steps, or blocks in FIG. 4 that recite a determining operation or involve a decision do not necessarily require that both branches of the determining operation be practiced. In other words, one of the branches of the determining operation can be deemed as an optional step. Furthermore, operations, steps or blocks of the above described method(s) can be combined, separated, and/or performed in a different order from that described above, without departing from the example examples of the present disclosure.

Figure 5:
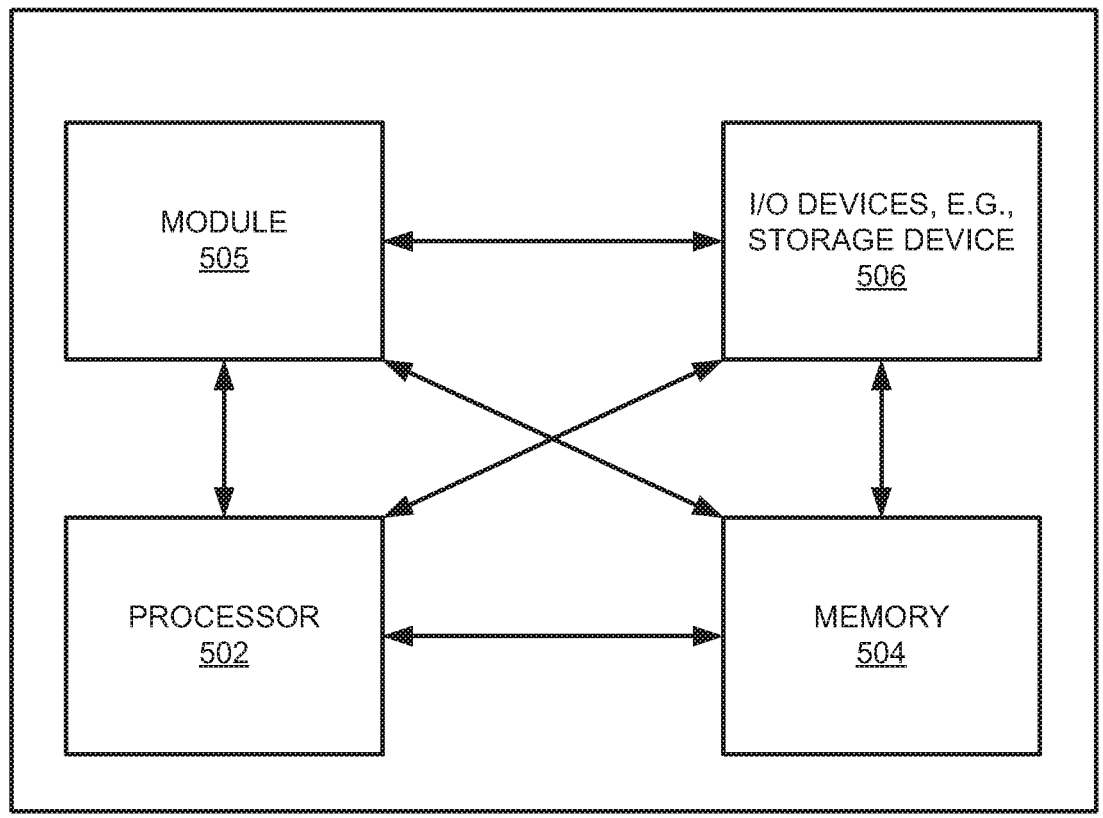
FIG. 5 depicts a high-level block diagram of a computing device specifically programmed to perform the functions described herein.

FIG. 5 depicts a high-level block diagram of a computing device 500 specifically programmed to perform the functions described herein. For example, any one or more components or devices illustrated in FIGS. 1-3 or described in connection with the method 400 may be implemented as the system 500. For instance, one or more components of the translation unit 104 of FIG. 1 could be implemented as illustrated in FIG. 5.

As depicted in FIG. 5, the system 500 comprises a hardware processor element 502, a memory 504, a module 505 for measuring temperature, and various input/output (I/O) devices 506.

The hardware processor 502 may comprise, for example, a microprocessor, a central processing unit (CPU), or the like. The memory 504 may comprise, for example, random access memory (RAM), read only memory (ROM), a disk drive, an optical drive, a magnetic drive, and/or a Universal Serial Bus (USB) drive. The module 505 for measuring temperature may include circuitry and/or logic for performing special purpose functions relating to the conversion of an electric current measurement to a temperature measurement. The input/output devices 506 may include, for example, a camera, a video camera, storage devices (including but not limited to, a tape drive, a floppy drive, a hard disk drive or a compact disk drive), a receiver, a transmitter, a speaker, a display, a speech synthesizer, an output port, and a user input device (such as a keyboard, a keypad, a mouse, and the like), or a sensor.

Although only one processor element is shown, it should be noted that the general-purpose computer may employ a plurality of processor elements. Furthermore, although only one general-purpose computer is shown in the Figure, if the method(s) as discussed above is implemented in a distributed or parallel manner for a particular illustrative example, i.e., the steps of the above method(s) or the entire method(s) are implemented across multiple or parallel general-purpose computers, then the general-purpose computer of this Figure is intended to represent each of those multiple general-purpose computers. Furthermore, one or more hardware processors can be utilized in supporting a virtualized or shared computing environment. The virtualized computing environment may support one or more virtual machines representing computers, servers, or other computing devices. In such virtualized virtual machines, hardware components such as hardware processors and computer-readable storage devices may be virtualized or logically represented.

It should be noted that the present disclosure can be implemented in software and/or in a combination of software and hardware, e.g., using application specific integrated circuits (ASIC), a programmable logic array (PLA), including a field-programmable gate array (FPGA), or a state machine deployed on a hardware device, a general purpose computer or any other hardware equivalents, e.g., computer readable instructions pertaining to the method(s) discussed above can be used to configure a hardware processor to perform the steps, functions and/or operations of the above disclosed method(s). In one embodiment, instructions and data for the present module or process 505 for measuring temperature (e.g., a software program comprising computer-executable instructions) can be loaded into memory 504 and executed by hardware processor element 502 to implement the steps, functions or operations as discussed above in connection with the example method 400. Furthermore, when a hardware processor executes instructions to perform "operations," this could include the hardware processor performing the operations directly and/or facilitating, directing, or cooperating with another hardware device or component (e.g., a co-processor and the like) to perform the operations.

The processor executing the computer readable or software instructions relating to the above described method(s) can be perceived as a programmed processor or a specialized processor. As such, the present module 505 for measuring temperature (including associated data structures) of the present disclosure can be stored on a tangible or physical (broadly non-transitory) computer-readable storage device or medium, e.g., volatile memory, non-volatile memory, ROM memory, RAM memory, magnetic or optical drive, device or diskette and the like. More specifically, the computer-readable storage device may comprise any physical devices that provide the ability to store information such as data and/or instructions to be accessed by a processor or a computing device such as a computer or an application server.

While various examples have been described above, it should be understood that they have been presented by way of example only, and not limitation. Thus, the breadth and scope of a preferred example should not be limited by any of the above-described examples, but should be defined only in accordance with the following claims and their equivalents.

What is claimed is:

1. An apparatus, comprising:
a first magnet, wherein the first magnet comprises a material having a magnetic field whose strength fluctuates in response to changes in temperature;
a magnetometer housing the first magnet, wherein the magnetic field induces an electric current in the magnetometer, wherein the magnetometer comprises a counter-wound inductive pickup coil that defines a generally cylindrical shell, and wherein the counter-wound inductive pickup coil includes at least a first pair of loops comprising a first loop for carrying the electric current in a first direction around the first magnet and at least a second loop for carrying the electric current in a second direction that is opposite to the first direction around the first magnet; and
a temperature converter coupled to the magnetometer to convert a measurement of the electric current to a corresponding measurement of temperature.

2. The apparatus of claim 1, wherein the strength increases when the first magnet is exposed to cold and weakens when the first magnet is exposed to heat.

3. The apparatus of claim 1, wherein the first magnet comprises a perovskite material.

4. The apparatus of claim 1, wherein the magnetometer further comprises:
a set of external coils positioned around the generally cylindrical shell.

5. The apparatus of claim 1, further comprising:
a voltmeter coupled between the magnetometer and the temperature converter, to provide the measurement of the electric current.

6. The apparatus of claim 1, further comprising:
a calibrated scale, accessible by the temperature converter, to map the measurement of the electric current to the measurement of the temperature.

7. The apparatus of claim 1, further comprising:
a second magnet housed within the magnetometer to enhance the electric current.

8. The apparatus of claim 7, wherein the second magnet comprises a ferromagnetic ribbon.

9. A method, comprising:
measuring an electric current induced in a magnetometer by a magnetic field whose strength fluctuates in response to changes in temperature, wherein the magnetometer comprises a counter-wound inductive pickup coil that defines a generally cylindrical shell, wherein the generally cylindrical shell houses at least a first magnet producing the magnetic field, and wherein the counter-wound inductive pickup coil includes at least a first pair of loops comprising a first loop for carrying the electric current in a first direction around the first magnet and at least a second loop for carrying the electric current in a second direction that is opposite to the first direction around the first magnet; and converting a measurement of the electric current to a measurement of temperature.

10. The method of claim 9, wherein the strength of the magnetic field increases when the first magnet is exposed to cold and weakens when the first magnet is exposed to heat.

11. The method of claim 9, wherein the first magnet comprises a perovskite material.

12. The method of claim 9, wherein the magnetometer further comprises:
a set of external coils positioned around the generally cylindrical shell.

13. The method of claim 9, wherein the converting comprises:
mapping the measurement of the electric current to the measurement of the temperature on a pre-calibrated scale.

14. The method of claim 9, wherein the electric current is enhanced by a second magnet housed within the magnetometer.

15. The method of claim 14, wherein the second magnet comprises a ferromagnetic ribbon.

16. A device, comprising:
a processor; and
a computer-readable medium storing instructions which, when executed by the processor, cause the processor to perform operations comprising:
measuring an electric current induced in a magnetometer by a magnetic field whose strength fluctuates in response to changes in temperature, wherein the magnetometer comprises a counter-wound inductive pickup coil that defines a generally cylindrical shell, wherein the generally cylindrical shell houses at least a first magnet producing the magnetic field, and wherein the counter-wound inductive pickup coil includes at least a first pair of loops comprising a first loop for carrying the electric current in a first direction around the first magnet and at least a second loop for carrying the electric current in a second direction that is opposite to the first direction around the first magnet; and
converting a measurement of the electric current to a measurement of temperature.

17. The device of claim 16, wherein the converting comprises:
mapping the measurement of the electric current to the measurement of the temperature on a pre-calibrated scale.

18. The device of claim 16, wherein the first magnet comprises a perovskite material.

19. The device of claim 16, wherein the magnetometer further comprises:
a set of external coils positioned around the generally cylindrical shell.

20. The device of claim 16, wherein the electric current is enhanced by a second magnet housed within the magnetometer, wherein the second magnet comprises a ferromagnetic ribbon.

* * * * *